(12) United States Patent
Arai et al.

(10) Patent No.: US 8,283,980 B2
(45) Date of Patent: Oct. 9, 2012

(54) AMPLIFIER CIRCUIT

(75) Inventors: Tomoyuki Arai, Kawasaki (JP); Masahiro Kudo, Kawasaki (JP); Shinji Yamaura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 515 days.

(21) Appl. No.: 12/567,492

(22) Filed: Sep. 25, 2009

(65) Prior Publication Data
US 2010/0039178 A1    Feb. 18, 2010

Related U.S. Application Data

(63) Continuation of application No. PCT/JP2007/057191, filed on Mar. 30, 2007.

(51) Int. Cl.
*H02J 7/00* (2006.01)
*H02J 7/16* (2006.01)
*H03F 3/04* (2006.01)
*H03F 3/217* (2006.01)

(52) U.S. Cl. ........ 330/253; 330/252; 330/261; 320/137; 320/140; 320/141; 320/142

(58) Field of Classification Search ................ 330/253, 330/254, 255, 260; 320/131, 141, 137, 140; 363/98, 16, 21.12, 21.15
See application file for complete search history.

(56) References Cited

U.S. PATENT DOCUMENTS

| | | | | |
|---|---|---|---|---|
| 5,442,274 A | * | 8/1995 | Tamai | 320/146 |
| 5,991,171 A | * | 11/1999 | Cheng | 363/21.03 |
| 6,124,700 A | * | 9/2000 | Nagai et al. | 320/132 |
| 6,252,458 B1 | | 6/2001 | Shibata | |
| 6,747,883 B2 | * | 6/2004 | Yasumura | 363/98 |
| 7,119,615 B2 | | 10/2006 | Ten Dolle et al. | |
| 7,265,999 B2 | * | 9/2007 | Murata et al. | 363/16 |
| 2002/0015317 A1 | * | 2/2002 | Umetsu et al. | 363/21.07 |
| 2002/0060598 A1 | | 5/2002 | Kimura | |
| 2003/0034842 A1 | | 2/2003 | Fanous et al. | |
| 2004/0037098 A1 | * | 2/2004 | Konno | 363/49 |
| 2004/0090805 A1 | * | 5/2004 | Kitano | 363/55 |

(Continued)

FOREIGN PATENT DOCUMENTS

GB    2 334 163 A    8/1999

(Continued)

OTHER PUBLICATIONS

Office Action from JP Application No. 2009-508829, dated Jun. 5, 2012.

*Primary Examiner* — Edward Tso
*Assistant Examiner* — Alexis Boateng
(74) *Attorney, Agent, or Firm* — Arent Fox LLP

(57) ABSTRACT

An amplifier circuit includes an amplifier unit and a current control circuit as means for achieving the aforementioned object. The amplifier unit includes a gain compensation MOS transistor compensating for gain of an output characteristic and a linearity compensation MOS transistor compensating for linearity of an output characteristic. A source of the gain compensation MOS transistor is connected to a drain of the linearity compensation MOS transistor. An input signal is applied to a gate of the linearity compensation MOS transistor. A drain of the gain compensation MOS transistor is set as an output. The current control circuit performs control so as to pass predetermined current between the drain and the source of the gain compensation MOS transistor and pass predetermined current between the drain and the source of the linearity compensation MOS transistor.

6 Claims, 5 Drawing Sheets

U.S. PATENT DOCUMENTS

2005/0285678 A1    12/2005  Kaviani et al.
2006/0285366 A1*   12/2006  Radecker et al. ............... 363/16
2007/0096696 A1*    5/2007  Lefley et al. .................. 320/141

FOREIGN PATENT DOCUMENTS

| JP | 03-278708 A  | 12/1991 |
| JP | 07-231234    | 8/1995  |
| JP | 2000-174568 A | 6/2000 |
| JP | 2001-292043  | 10/2001 |
| JP | 2002-076800  | 3/2002  |
| JP | 2005-523632 A | 8/2005 |
| JP | 2005-341149 A | 12/2005 |
| JP | 2006-174033 A | 6/2006 |

* cited by examiner

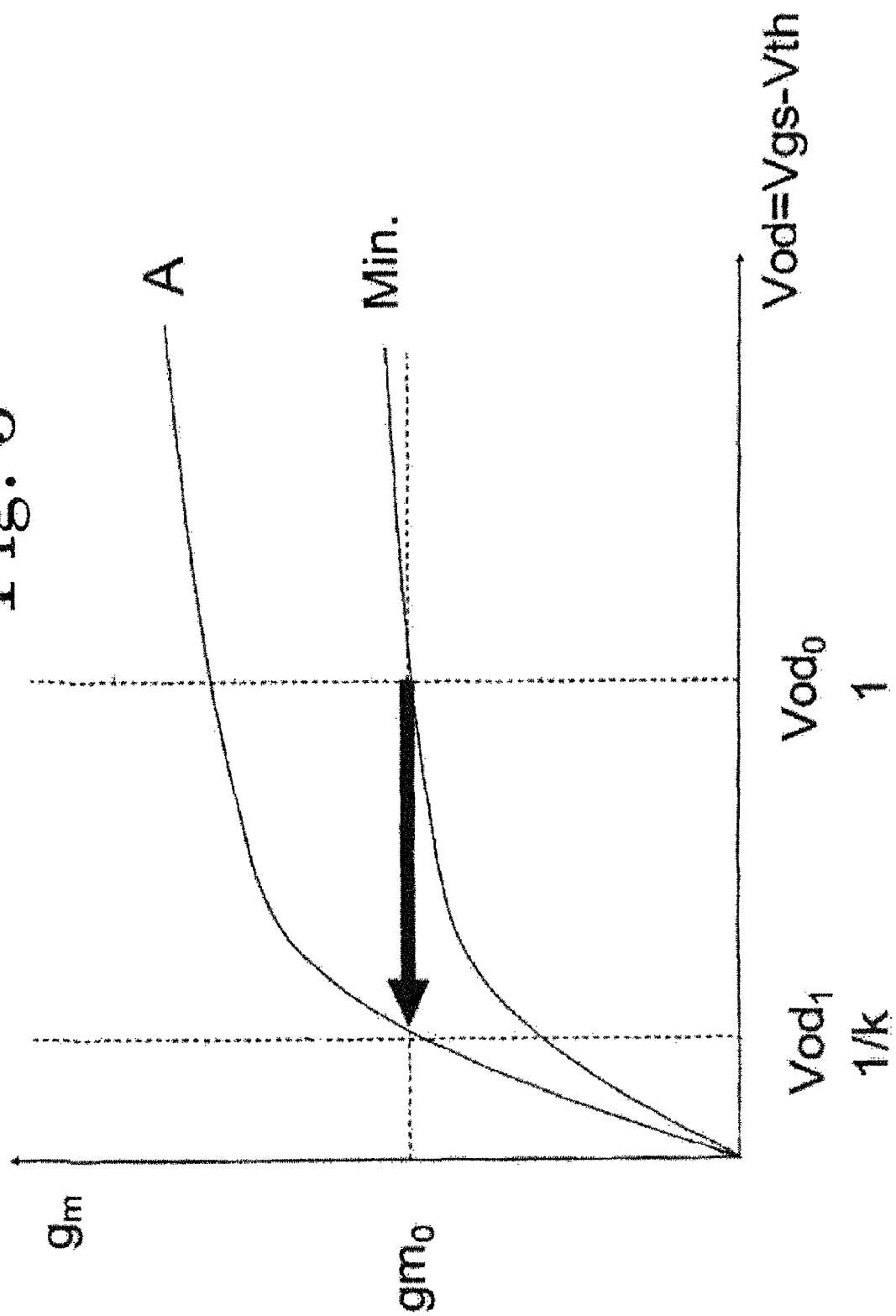

AMPLIFIER CIRCUIT

CROSS-REFERENCE TO RELATED APPLICATION

This is a continuation application of international PCT application No. PCT/JP2007/57191 filed on Mar. 30, 2007, the entire contents of which are incorporated herein by reference.

FIELD

The embodiments discussed herein are related to an amplifier circuit.

BACKGROUND

In a MOS transistor that amplifies radio frequency signals in, for example, WiMAX, a reduction in the size of each element is required. Thus, for example, the width and length of the gate of an amplifying MOS transistor are subject to variation during manufacturing. Thus, when MOS transistors are cascaded, and amplification is performed, necessary gain may not be achieved under the influence of a variation in gain. Gain "gain" of a MOS transistor can be expressed by equation 1 described below. In equation 1, R represents resistance associated with a MOS transistor, and gm represents mutual conductance.

$$\text{gain} = gm \cdot R \qquad \text{[equation 1]}$$

According to the foregoing equation, the gain of a MOS transistor may be maintained constant by compensating for the mutual conductance gm. Thus, hitherto, a mutual conductance compensation circuit that compensates for the mutual conductance of a MOS transistor has been provided in an amplifier circuit.

FIG. 1 indicates the components of an amplifier circuit provided with mutual conductance compensation circuits. The amplifier circuit includes an amplifier unit 9, a first mutual conductance compensation circuit 7, a second mutual conductance compensation circuit 8, and MOS transistors 4, 5, and 6 for connecting the circuits to each other.

The amplifier unit 9 includes a first MOS transistor 1, a second MOS transistor 2, a third MOS transistor 3, a first inductor 15, and a second inductor 16. One end of each of the first inductor 15 and the second inductor 16 is connected to a drain-side voltage source AVD. The other ends of the first inductor 15 and the second inductor 16 are connected to the drains of the second MOS transistor 2 and the third MOS transistor 3, respectively. The source of each of the second MOS transistor 2 and the third MOS transistor 3 is connected to the drain of the first MOS transistor 1. Input signals are input to the gate of each of the second MOS transistor 2 and the third MOS transistor 3. The source of the first MOS transistor 1 is connected to a ground AVS.

One end of the first mutual conductance compensation circuit 7 is connected to the drain-side voltage source AVD. The first mutual conductance compensation circuit 7 is a circuit that generates current for controlling mutual conductance so that the mutual conductance is maintained constant. The other end of the first mutual conductance compensation circuit 7 is connected to the drain of the fourth MOS transistor 4. The source of the fourth MOS transistor 4 is connected to the ground AVS. The gate of the fourth MOS transistor 4 is connected to the drain of the MOS transistor 4. Moreover, the gate of the fourth MOS transistor 4 is connected to the gate of the first MOS transistor 1.

One end of the second mutual conductance compensation circuit 8 is connected to the drain-side voltage source AVD. The second mutual conductance compensation circuit 8 is a circuit that generates current for controlling mutual conductance so that the mutual conductance is maintained constant. The other end of the second mutual conductance compensation circuit 8 is connected to the drain of the fifth MOS transistor 5. The source of the fifth MOS transistor 5 is connected to the drain of the sixth MOS transistor 6. The source of the sixth MOS transistor 6 is connected to the ground AVS. The gate of the sixth MOS transistor 6 is connected to the gate of the first MOS transistor 1 and the gate of the fourth MOS transistor. The gate of the fifth MOS transistor 5 is connected to the drain of the fifth MOS transistor 5. Moreover, the gate of the fifth MOS transistor 5 is connected to the respective gates of the second MOS transistor 2 and the third MOS transistor 3 via resistors 17 and 18.

The first mutual conductance compensation circuit 7 generates current such that the mutual conductance gm of the first MOS transistor 1 is maintained constant and mirrors bias to the first MOS transistor 1, using the fourth MOS transistor 4.

The second mutual conductance compensation circuit 8 generates current such that the mutual conductance gm of the second MOS transistor 2 and the third MOS transistor 3 is maintained constant and mirrors bias to the second MOS transistor 2 and the third MOS transistor 3, using the fifth MOS transistor 5.

As a MOS transistor becomes smaller, manufacturing errors in the width and length of the gate of a MOS transistor become large, resulting in a difference in the mutual conductance gm, as indicated in FIG. 2. FIG. 2 indicates characteristics of a circuit in FIG. 1. In FIG. 2, a maximum value characteristic Max represents a MOS transistor having the largest mutual conductance. A minimum value characteristic Min represents a MOS transistor having the smallest mutual conductance. Reference letter Typ represents a MOS transistor having mutual conductance of a standard value characteristic. The standard value characteristic Typ is a characteristic based on the gate electrode width and the gate electrode length set in the design stage. It is assumed here that overdrive voltage Vod=gate-source voltage Vgs−threshold voltage Vth.

In FIG. 2, in order to compensate for the gain of a MOS transistor the mutual conductance gm of which is lower than that in the standard value characteristic Typ, as indicated by the minimum value characteristic Min, the overdrive voltage Vod needs to be increased. In order to compensate for the mutual conductance gm of each MOS transistor only by bias, Vgs needs to be increased until Vod=Vod$_0$. However, even when Vgs is increased until Vod=Vod$_0$, as indicated in FIG. 2, in a MOS transistor having the minimum value characteristic Min, in which the mutual conductance gm is far less than that in the standard value characteristic Typ, Vgs cannot be increased until the mutual conductance gm reaches mutual conductance gm1 in the standard value characteristic Typ. Thus, when the mutual conductance gm decreases, it may be impossible to compensate for the gain only by controlling the gate-source voltage Vgs of a MOS transistor.

On the other hand, in the case of a MOS transistor the mutual conductance gm of which is higher than that in the standard value characteristic Typ, as indicated by the maximum value characteristic Max, in order to compensate for the gain, the gate-source voltage Vgs needs to be controlled to be decreased so that Vod=Vod$_2$. In this case, the mutual conductance gm can be compensated for. However, the overdrive voltage Vod decreases, and thus the amplitude of an input signal that can be linearly amplified decreases. That is, the linearity is deteriorated by compensating for the mutual conductance gm.

When variations occur in elements under the influence of the manufacturing process, the compatibility of compensation for the gain of a MOS transistor with compensation for the linearity cannot be achieved only by controlling the gate-source voltage Vgs.

Japanese Laid-open Patent Publication No. 2000-174568 is known as a technique for bias control for a variation in the gain of the amplifier unit 9.

SUMMARY

According to an aspect of the invention, an amplifier circuit includes an amplifier unit including a gain compensation MOS transistor for compensating output characteristics of gain, a linearity compensation MOS transistor for compensating output characteristics of linearity, a source of the gain compensation MOS transistor for connecting with a drain of the linear characteristics compensation MOS transistor, a drain of the gain compensation MOS transistor being set as an output, and a gate of the linear characteristics compensation MOS transistor for inputting an input signal; and a bias control circuit for controlling to apply predetermined current flowing through the drain to the source of the gain compensation MOS transistor, and to apply predetermined current flowing through the drain to the source of the linearity compensation MOS transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a characteristic curve indicating gain compensation for fourth and fifth MOS transistors.

DESCRIPTION OF EMBODIMENTS

Embodiments will now be described with reference to the drawings. The arrangement of the embodiment is illustrative, and the embodiments are not limited to the arrangement of the embodiment.

Circuit Configuration

Figure 1:
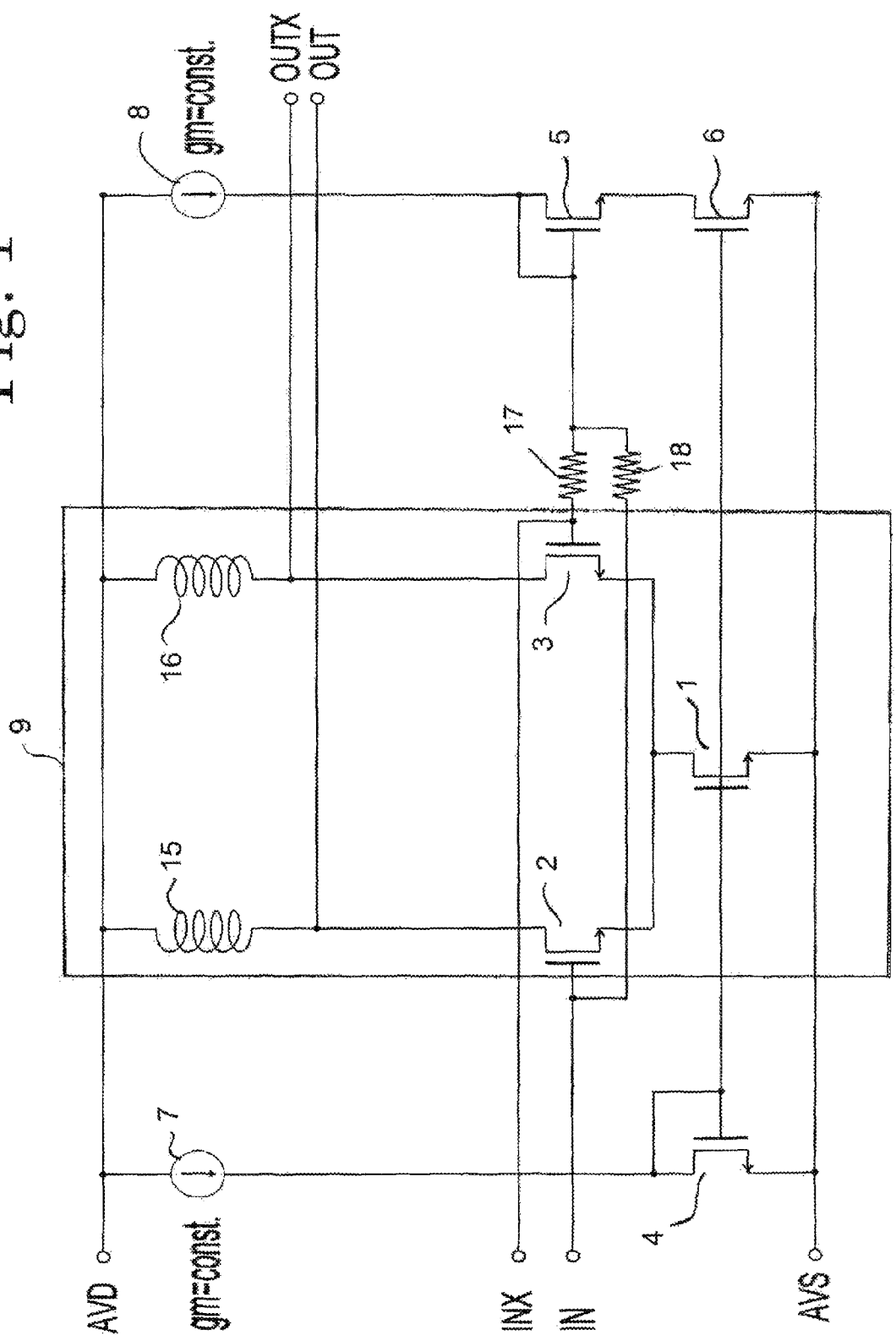
FIG. 1 is a diagram indicating an amplifier circuit provided with mutual conductance compensation circuits.
Figure 2:
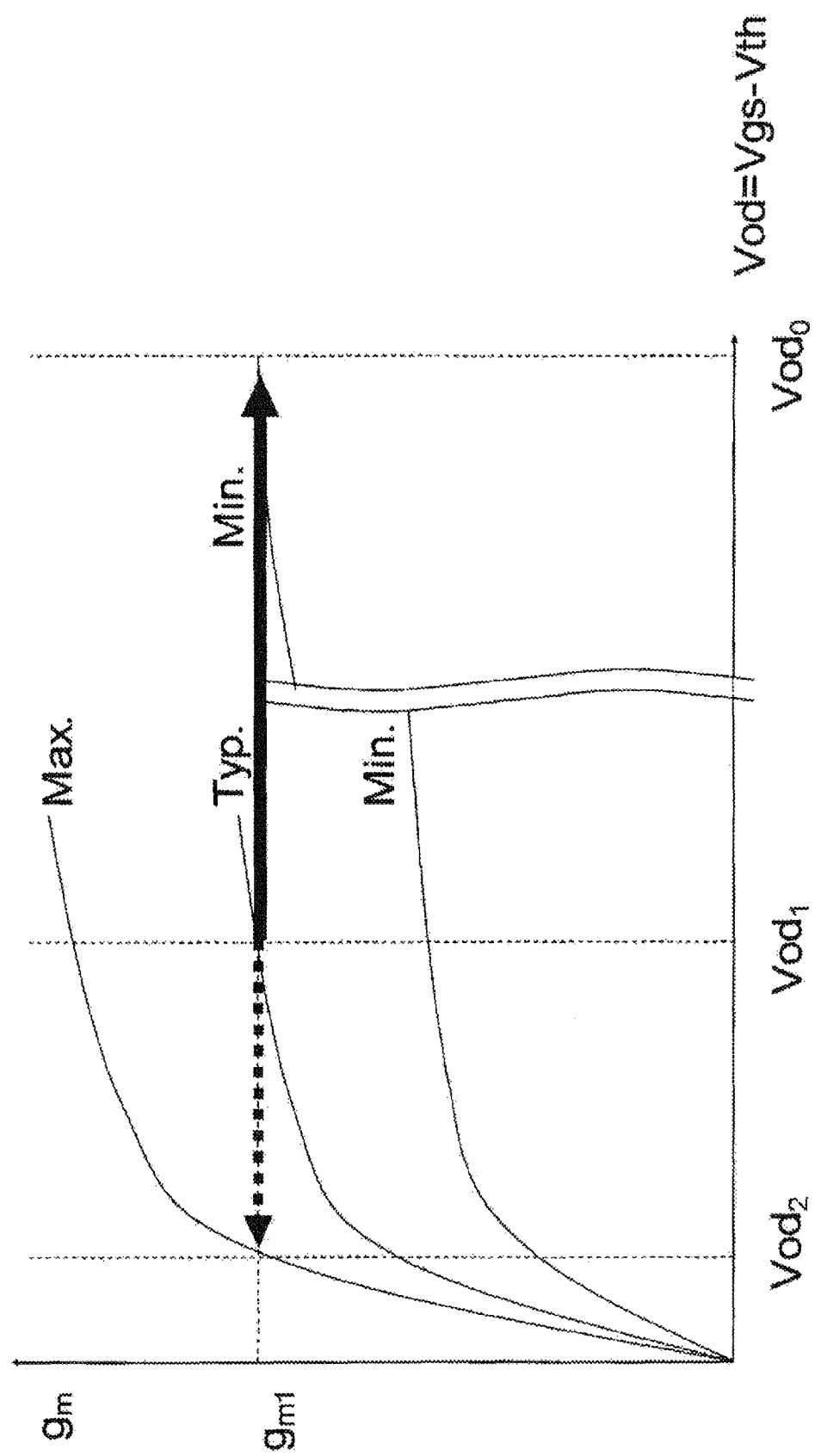
FIG. 2 is a diagram indicating characteristics of a circuit in FIG. 1.
Figure 3:
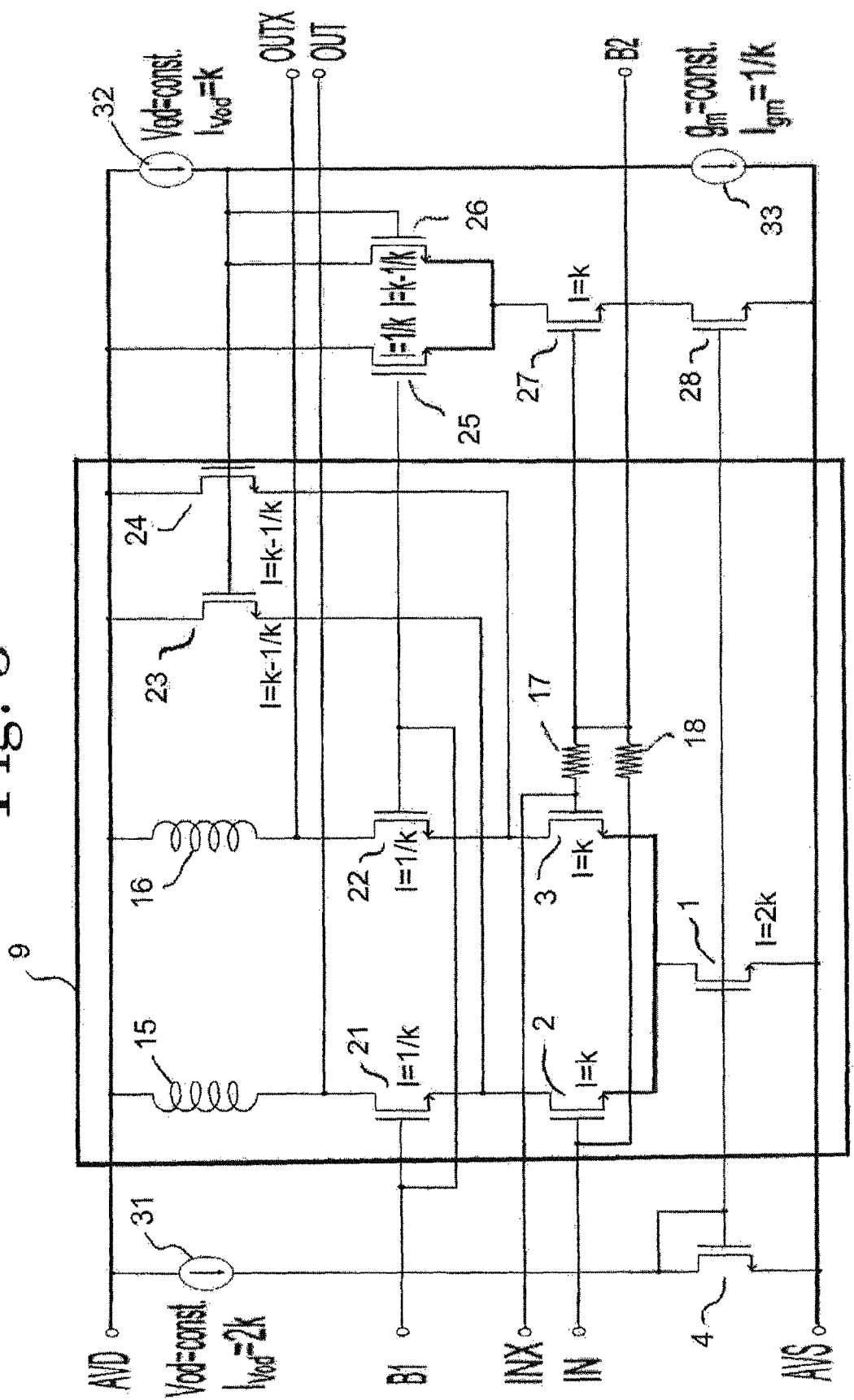
FIG. 3 is a diagram indicating an amplifier circuit that includes a bias circuit according to the embodiment.

FIG. 3 indicates an amplifier circuit that includes a bias circuit according to the present invention. The amplifier circuit in FIG. 3 includes an amplifier unit 9 and a circuit that controls the bias thereof.

The amplifier unit 9 includes a first MOS transistor 1, a second MOS transistor 2, a third MOS transistor 3, a fourth MOS transistor 21, a fifth MOS transistor 22, a seventh MOS transistor 23, an eighth MOS transistor 24, a first inductor 15, and a second inductor 16.

One end of each of the first inductor 15 and the second inductor 16 is connected to a drain-side voltage source AVD. The other ends of the first inductor 15 and the second inductor 16 are connected to the drains of the fourth MOS transistor 21 and the fifth MOS transistor 22, respectively. The drains of the fourth MOS transistor 21 and the fifth MOS transistor 22 are the outputs of the amplifier unit. Thus, the fourth MOS transistor 21 and the fifth MOS transistor 22 constitute an output transistor circuit. In the embodiment, bias voltage B1 is applied to the respective gates of the fourth MOS transistor 21 and the fifth MOS transistor 22 so as to enable the operation when the circuit is turned on.

The source of the fourth MOS transistor 21 is connected to the drain of the second MOS transistor 2. The source of the fifth MOS transistor 22 is connected to the drain of the third MOS transistor 3. The source of each of the second MOS transistor 2 and the third MOS transistor 3 is connected to the drain of the first MOS transistor 1. Input signals are input to the gate of each of the second MOS transistor 2 and the third MOS transistor 3. The second MOS transistor 2 and the third MOS transistor 3 constitute an input transistor circuit. In the embodiment, bias voltage B2 is applied to the respective gates of the second MOS transistor 2 and the third MOS transistor 3 so as to enable the operation when the circuit is turned on.

A first Vod constant control circuit 31 is a circuit that generates current for controlling overdrive voltage Vod so that the overdrive voltage Vod is maintained constant. One end of the first Vod constant control circuit 31 is connected to the drain-side voltage source AVD. The other end of the first Vod constant control circuit 31 is connected to the drain of a sixth MOS transistor 4. The source of the sixth MOS transistor 4 is connected to a ground AVS. The gate of the sixth MOS transistor 4 is connected to the drain of the sixth MOS transistor 4. Moreover, the gate of the sixth MOS transistor 4 is connected to the gate of the first MOS transistor 1 and the gate of a twelfth MOS transistor 28.

The drain of each of the seventh MOS transistor 23 and the eighth MOS transistor 24 is connected to the drain-side voltage source AVD. The source of the seventh MOS transistor 23 is connected to the drain of the second MOS transistor 2. The source of the eighth MOS transistor 24 is connected to the drain of the third MOS transistor 3. The seventh MOS transistor 23 and the eighth MOS transistor 24 constitute a bypass unit that bypasses current so as not to pass current other than predetermined current through the fourth MOS transistor 21 and the fifth MOS transistor 22.

Thus, resultant current of the drain-source current of the seventh MOS transistor 23 and the fourth MOS transistor 21 is the drain-source current of the second MOS transistor 2. Moreover, resultant current of the drain-source current of the eighth MOS transistor 24 and the fifth MOS transistor 22 is the drain-source current of the third MOS transistor 3.

The drain of a ninth MOS transistor 25 is connected to the drain-side voltage source AVD. The source of the ninth MOS transistor 25 is connected to the drain of an eleventh MOS transistor 27.

A second Vod constant control circuit 32 is a circuit that generates current for controlling the overdrive voltage Vod so that the overdrive voltage Vod is maintained constant. One terminal of the second Vod constant control circuit 32 is connected to the drain-side voltage source AVD. The drain of a tenth MOS transistor 26 is connected to the other terminal of the second Vod constant control circuit 32. The gate of the tenth MOS transistor 26 is connected to the other terminal of the second Vod constant control circuit 32. The source of the tenth MOS transistor 26 is connected to the drain of the eleventh MOS transistor 27.

The gate of the eleventh MOS transistor 27 is connected to the gate of the second MOS transistor 2 and the gate of the third MOS transistor 3 via resistors 17 and 18. The source of the eleventh MOS transistor 27 is connected to the drain of the twelfth MOS transistor 28. The gate of the twelfth MOS transistor 28 is connected to the gate of the first MOS transistor 1 and the gate of the sixth MOS transistor 4. The source of the twelfth MOS transistor 28 is connected to the ground AVS.

A mutual conductance constant control circuit 33 is a circuit that generates current for controlling mutual conductance gm so that the mutual conductance gm is maintained constant.

One end of the mutual conductance constant control circuit 33 is connected to the other end of the second Vod constant control circuit. The other end of the mutual conductance constant control circuit 33 is connected to the ground AVS.

In this amplifier circuit, the compatibility of gain compensation with linearity compensation is achieved by maintaining Vod of the second MOS transistor 2 and the third MOS transistor 3 constant so as to compensate for the linearity and maintaining the mutual conductance gm of the fourth MOS transistor 21 and the fifth MOS transistor 22 constant so as to compensate for the gain.

Circuit Characteristics

Figure 4:
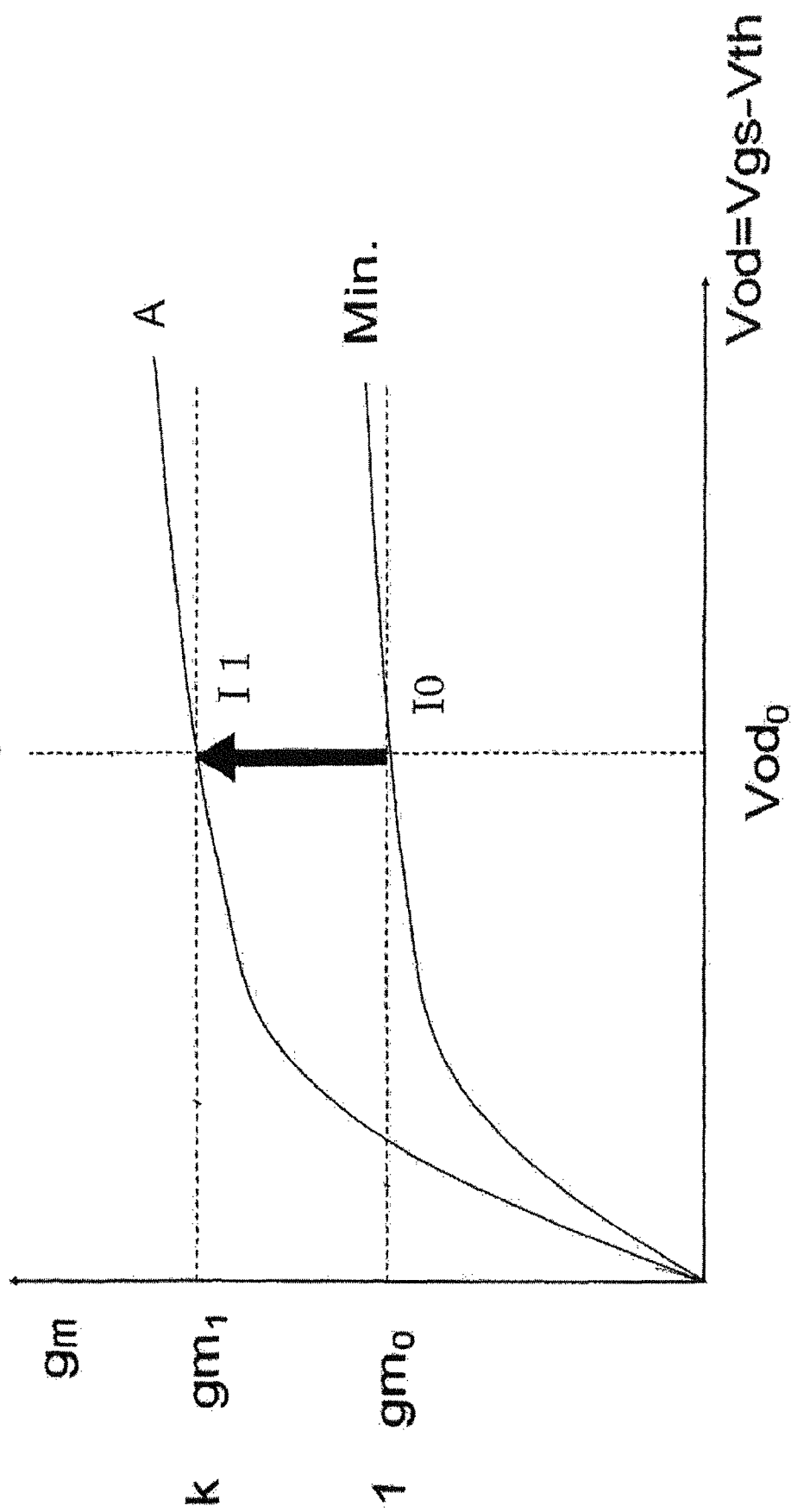
FIG. 4 is a characteristic curve indicating linearity compensation for second and third MOS transistors.

How the compatibility of gain compensation with linearity compensation is achieved in a case where the mutual conductance gm in a design minimum value characteristic Min transitions to a state A will now be described. FIG. 4 is a diagram indicating linearity compensation. FIG. 5 is a diagram indicating gain compensation. In FIGS. 4 and 5, the design minimum value characteristic Min represents the characteristic of a MOS transistor having the smallest mutual conductance in design. The state A represents the characteristic of an actual MOS transistor having been subjected to a manufacturing process.

The control for maintaining the overdrive voltage Vod constant to perform linearity compensation will now be described, using FIG. 4. Current I necessary for the second MOS transistor 2 and the third MOS transistor 3 to perform linearity compensation is expressed by the following equation:

$$I = \beta \cdot Vod^2 \quad \text{[equation 2]}$$

where a coefficient $\beta$ can be expressed by the following equation:

$$\beta = (\mu \cdot Co \cdot W)/(2L) \quad \text{[equation 3]}$$

where $\mu$ represents the movement speed of electrons, Co represents the capacitance of a gate insulating film per unit area, W represents the width of the gate insulating film, and L represents the length of the gate insulating film.

Equation 4 is obtained by transposing mutual conductance in equation $$gm = 2\beta \cdot Vod \quad \text{[equation 4]}$$

The points of the individual characteristics are defined as follows on the basis of the characteristics in FIG. 4. The mutual conductance gm, the current I, the coefficient $\beta$, and the overdrive voltage Vod in the design minimum value characteristic Min of the mutual conductance gm are defined as mutual conductance $gm_0$, $I_0$, $\beta_0$, and $Vod_0$. The mutual conductance gm, the current I, the coefficient $\beta$, and the overdrive voltage Vod in the state A are defined as $gm_1$, $I_1$, $\beta_1$, and $Vod_0$. Moreover, under the condition of predetermined overdrive voltage, current that passes through the second MOS transistor 2 and the third MOS transistor 3 in the design minimum value characteristic Min of the mutual conductance gm is defined as 1, and current that passes through in the state A is defined as k. The same overdrive voltage Vod in the state A and the design minimum value characteristic Min means that the overdrive voltage Vod is controlled so that the overdrive voltage Vod is maintained constant at the overdrive voltage $Vod_0$.

$$k/1 = I_1/I_0 \quad \text{[equation 5]}$$

Equation 6 is formulated on the basis of equation 2.

$$k = I_1/I_0 = (\beta_1/\beta_0) \cdot (Vod_0/Vod_0) \quad \text{[equation 6]}$$

$$k = (\beta_1/\beta_0)1 \quad \text{[equation 7]}$$

$$k = \beta_1/\beta_0 \quad \text{[equation 8]}$$

According to equation 5 and equation 8, the ratio between current in the design minimum value characteristic Min and current in the state A is the same as the ratio between coefficients of an amplifying MOS transistor. In order to maintain the overdrive voltage Vod constant so as to perform linearity compensation, when current of k passes through a MOS transistor, equation 8 is satisfied.

Current that passes through a mutual conductance gm compensation circuit to compensate for the respective gains of the fourth and fifth MOS transistors can be expressed as below on the basis of FIG. 5. It is assumed that the mutual conductance gm and the overdrive voltage Vod in the design minimum value characteristic Min are $gm_0$ and $Vod_0$, and the mutual conductance gm and the overdrive voltage Vod in the state A are $gm_1$ and $Vod_1$. A value of one obtained by dividing the mutual conductance gm in the state A by the mutual conductance gm in the design minimum value characteristic Min means that gm is the same value. That is, this means that the mutual conductance gm is controlled so that the mutual conductance gm is maintained constant at the mutual conductance $gm_0$.

$$1 = gm_1/gm_0 = (\beta_1/\beta_0)(Vod_1/Vod_0) \quad \text{[equation 9]}$$

Equation 10 is obtained by substituting equation 8 into equation 9.

$$1 = gm_1/gm_0 = k(Vod_1/Vod_0) \quad \text{[equation 10]}$$

$$Vod_1/Vod_0 = 1/k \quad \text{[equation 11]}$$

Current values in the individual characteristics can be expressed by equation 12 and equation 13.

$$Igm_1 = \beta_1 \cdot Vod_1^2 \quad \text{[equation 12]}$$

$$Igm_0 = \beta_0 \cdot Vod_0^2 \quad \text{[equation 13]}$$

Current necessary for control can be expressed by equation 14.

$$Igm_1/Igm_0 = (\beta_1/\beta_0) \cdot (Vod_1^2/Vod_0^2) \quad \text{[equation 14]}$$

Equation 15 is obtained by substituting equation 8 and equation 11 into equation 14.

$$Igm_1/Igm_0 = k(1/k)^2 \quad \text{[equation 15]}$$

$$Igm_1/Igm_0 = 1/k \quad \text{[equation 16]}$$

According to equation 16, when the overdrive voltage Vod is maintained constant, in order to compensate for the mutual conductance gm, current of 1/k needs to pass through a MOS transistor.

Circuit Operation

According to the aforementioned concept regarding current values, current of k is passed through the second Vod constant control circuit 32 so as to maintain the overdrive voltage Vod constant. Under this condition, current of 1/k is passed through the mutual conductance constant control circuit 33. Moreover, a current value of 2k adjusted to the value of current that passes through an amplifying MOS transistor for performing linearity compensation is passed through the first Vod constant control circuit 31. In the embodiment, since the mirror ratio between the sixth MOS transistor 4 and the first MOS transistor 1 is one, the current value is 2k. However, when the mirror ratio between the sixth MOS transistor 4 and the first MOS transistor 1 is changed, the current value can be set to nk (n can be a predetermined value corresponding to the mirror ratio). Thus, the first Vod constant control circuit 31 generates current of 2k, and bias is mirrored to the first MOS transistor 1 and the twelfth MOS transistor 28 via the sixth MOS transistor 4. Since the first MOS transistor 1 and the sixth MOS transistor 4 having the same width and length of the gate insulating film are used, current of 2k passes through the first MOS transistor 1 and the sixth MOS transistor 4. The twelfth MOS transistor 28 having the width and length of the gate insulating film different from those of the first MOS transistor 1 and the sixth MOS transistor 4 is used so that current of k passes through the twelfth MOS transistor 28.

The second Vod constant control circuit 32 is connected in series with the mutual conductance constant control circuit 33. Thus, the differential current of k−(1/k) is the drain-source current of the tenth MOS transistor 26 provided in parallel with the mutual conductance constant control circuit 33. The bias of the tenth MOS transistor 26 is mirrored to the seventh MOS transistor 23 and the eighth MOS transistor 24. Thus, current of k−(1/k) passes through the seventh MOS transistor 23 and the eighth MOS transistor 24.

Since the source of the eleventh MOS transistor 27 is connected to the drain of the twelfth MOS transistor 28, current of k flows between the drain and source of the eleventh MOS transistor 27. Thus, the differential current of 1/k between the drain-source current of k−(1/k) of the tenth MOS transistor 26 and the drain-source current of k of the eleventh MOS transistor 27 passes through the ninth MOS transistor 25.

The bias of the ninth MOS transistor 25 is mirrored to the fourth MOS transistor 21 and the fifth MOS transistor 22. Thus, current of 1/k passes through the fourth MOS transistor 21 and the fifth MOS transistor 22.

That is, when Vod of the second MOS transistor 2 and the third MOS transistor 3 is attempted to be maintained constant, the current value of the fourth MOS transistor 21 and the fifth MOS transistor 22 becomes k, and thus the mutual conductance gm cannot be maintained constant. Thus, in order to maintain the mutual conductance gm constant, unnecessary current is passed through the seventh MOS transistor 23 and the eighth MOS transistor 24. Current of 1/k necessary to maintain gm of the fourth MOS transistor 21 and the fifth MOS transistor 22 constant is passed through the fourth MOS transistor 21 and the fifth MOS transistor 22 by this operation, and the mutual conductance gm is compensated for. In this arrangement, the mutual conductance gm of the amplifier can be compensated for, and the gain can be also compensated for.

In the aforementioned embodiment, the relationship between current through the amplifier unit and current through the circuit applying bias to the amplifier unit is set to 1:1. However, when current that passes through the amplifier unit can be set to k and 1/k, current that passes through the circuit applying bias to the amplifier unit is not limited to k and 1/k. For example, the relationship between current through the amplifier unit and current through the circuit applying bias to the amplifier unit can be set to 1:N by making a selection of β of each of the ninth MOS transistor 25, the tenth MOS transistor 26, the eleventh MOS transistor 27, the eleventh MOS transistor 28, and the sixth MOS transistor 4 and making a selection of the current value of each of the first and second Vod constant control circuits 31 and 32 and a selection of the current value of the mutual conductance constant control circuit 33.

ADVANTAGE

According to the present invention, in an amplifier circuit, when a characteristic due to the manufacturing variation of a MOS transistor is compensated for, the compatibility of linearity compensation of gain with gain compensation can be achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An amplifier circuit comprising:
an amplifier unit including:
a gain compensation MOS transistor for compensating output characteristics of gain,
a linearity compensation MOS transistor for compensating output characteristics of linearity,
a source of the gain compensation MOS transistor for connecting with a drain of the linear characteristics compensation MOS transistor,
a drain of the gain compensation MOS transistor being set as an output, and
a gate of the linear characteristics compensation MOS transistor for inputting an input signal; and
a bias control circuit for controlling to apply predetermined current flowing through the drain to the source of the gain compensation MOS transistor, and to apply predetermined current flowing through the drain to the source of the linearity compensation MOS transistor.

2. The amplifier circuit of claim 1, wherein the bias control circuit controls to keep a value that subtracts a threshold voltage from the gate to source voltage of the linearity compensation MOS transistor.

3. The amplifier circuit of claim 1, wherein the bias control circuit controls to keep a current Ids flowing through the drain to the source of the gain compensation MOS transistor, or controls a current to keep a mutual conductance Gm.

4. The amplifier circuit of claim 1, wherein the bias control circuit controls a current so that the current flowing through the drain to the source of the linearity compensation MOS transistor is a reciprocal of current that passes between the drain and the source of the gain compensation MOS transistor.

5. The amplifier circuit of claim 1, wherein the amplifier unit includes a bypass unit for generating a part of current that passes between the drain and the source of the linearity compensation MOS transistor, and the current flowing through the drain to the source of the linear characteristics compensation MOS transistor is obtained by adding the current flowing through the drain to the source of the gain compensation MOS transistor and the current flowing through the bypass unit.

6. The amplifier circuit according to claim 1, wherein the bias control circuit includes a first current source for maintaining overdrive voltage Vod of the linearity compensation MOS transistor constant, and a second current source for maintaining mutual conductance Gm of the gain compensation MOS transistor constant.

* * * * *